United States Patent
Lee (10) Patent No.: US 9,147,697 B2
(45) Date of Patent: Sep. 29, 2015

(54) MANUFACTURING METHOD OF ARRAY SUBSTRATE, ARRAY SUBSTRATE, AND DISPLAY APPARATUS

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventor: Yunbok Lee, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 13/806,182

(22) PCT Filed: Nov. 9, 2012

(86) PCT No.: PCT/CN2012/084404
§ 371 (c)(1),
(2) Date: Dec. 21, 2012

(87) PCT Pub. No.: WO2013/075591
PCT Pub. Date: May 30, 2013

(65) Prior Publication Data
US 2014/0054626 A1      Feb. 27, 2014

(30) Foreign Application Priority Data

Nov. 24, 2011   (CN) .......................... 2011 1 0379466

(51) Int. Cl.
| H01L 21/00 | (2006.01) |
| H01L 27/12 | (2006.01) |
| G02F 1/1362 | (2006.01) |

(52) U.S. Cl.
CPC .......... *H01L 27/124* (2013.01); *H01L 27/1259* (2013.01); *H01L 27/1288* (2013.01); *G02F 1/136227* (2013.01); *G02F 2001/136231* (2013.01)

(58) Field of Classification Search
USPC .......................................... 438/96
See application file for complete search history.

(56) References Cited

U.S. PATENT DOCUMENTS

| 8,390,752 B2 * | 3/2013 | Yang et al. ....................... 349/42 |
| 2002/0135722 A1 | 9/2002 | Lee |

(Continued)

FOREIGN PATENT DOCUMENTS

| CN | 1377020 A | 10/2002 |
| CN | 101276106 A | 10/2008 |

(Continued)

OTHER PUBLICATIONS

First Chinese Office Action dated Jul. 30, 2013; Appln. No. 201110379466.3.
International Search Report dated Aug. 1, 2013; PCT/CN2012/084404.
Chinese Rejection Decision dated Sep. 30, 2013; Appln. No. 201110379466.3.
International Preliminary Report on Patentability dated May 27, 2014; PCT/CN2012/084404.

*Primary Examiner* — Bilkis Jahan
(74) *Attorney, Agent, or Firm* — Ladas & Parry LLP (57) ABSTRACT

The present disclosure relates to an array substrate and the manufacturing method thereof, and a display apparatus. The manufacturing method of the array substrate comprises following step. A gate insulating layer and an active layer is formed on the substrate with said gate electrode and said common electrode formed thereon. A source drain layer is formed on the substrate with said gate insulating layer and said active layer formed thereon. A passivation layer is formed on the substrate with said source drain layer formed thereon, and a through hole is formed in the passivation layer; a pixel electrode is formed on the substrate with said passivation layer formed thereon with said through hole. The pixel electrode is connected to the drain electrode in the source drain layer through said through hole. The process for forming the pixel electrode comprises first etching, ashing and second etching.

10 Claims, 6 Drawing Sheets

(56) References Cited

U.S. PATENT DOCUMENTS

| | | | |
|---|---|---|---|
| 2006/0284549 A1* | 12/2006 | Lee | 313/503 |
| 2007/0001961 A1 | 1/2007 | Yoo et al. | |
| 2008/0108226 A1* | 5/2008 | Oh et al. | 438/762 |
| 2008/0239181 A1 | 10/2008 | Jin | |
| 2008/0284967 A1* | 11/2008 | Oh et al. | 349/144 |
| 2009/0027607 A1* | 1/2009 | Kim et al. | 349/155 |
| 2009/0057667 A1* | 3/2009 | Yang et al. | 257/59 |
| 2010/0047974 A1 | 2/2010 | Lim et al. | |
| 2010/0207122 A1* | 8/2010 | Oh et al. | 257/59 |
| 2011/0136277 A1 | 6/2011 | Park et al. | |
| 2011/0261297 A1* | 10/2011 | Yoshida et al. | 349/96 |
| 2013/0037814 A1* | 2/2013 | Oh et al. | 257/59 |

FOREIGN PATENT DOCUMENTS

| | | |
|---|---|---|
| CN | 101290937 A | 10/2008 |
| CN | 101656230 A | 2/2010 |
| CN | 102087450 A | 6/2011 |
| CN | 102629587 A | 8/2012 |

\* cited by examiner

MANUFACTURING METHOD OF ARRAY SUBSTRATE, ARRAY SUBSTRATE, AND DISPLAY APPARATUS

FIELD

The present disclosure generally relates to an array substrate, a manufacturing method thereof and a display apparatus.

BACKGROUND

There has been a rapid progress in thin film transistor liquid crystal display (TFT-LCD) in the past few years. Although picture quality of a LCD (liquid crystal display) from front view might be great, the color might change if viewed from the side. Therefore wide viewing angle technologies become popular for reducing the color change upon viewing from the side. Advanced super dimension switch (ADSDS) is one of the wide viewing angle technologies recently developed to meet the requirements of a large screen high definition LCD for desktop and TV. In ADSDS technology, a multi-dimensional field is formed using a field formed by edges of the slit electrodes within a same plane and the field formed between the slit electrode and a plate electrode, causing rotations of liquid crystal molecules in any orientations within the liquid crystal cells between the slit electrodes and right above the electrodes, thereby increasing operation efficiency of the liquid crystals as well as improving the light transmittance. By ADSDS technology, display quality of a TFT-LCD can be improved with various advantages including high resolution, high transmittance, low power consumption, wide view angle, high aperture ratio, low chromatism, and no push mura etc.

Figure 1:
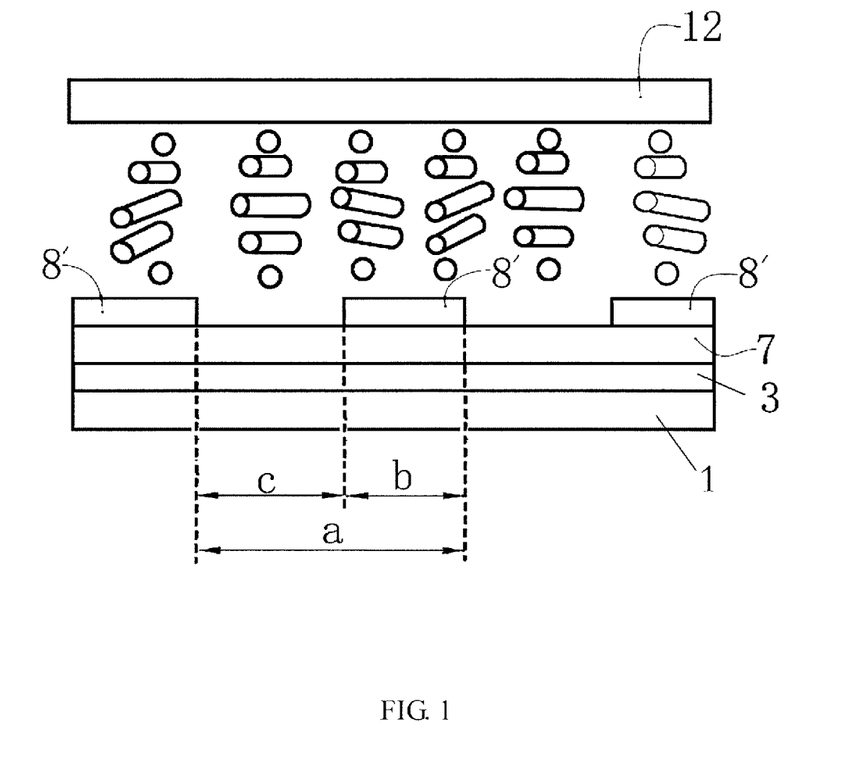
FIG. 1 is a schematic view of a conventional ADSDS LCD panel.

As shown in FIG. 1, an ADSDS LCD panel comprises a color filter substrate 12 and an array substrate including a lower transparent ITO common electrode 3' (Vcom, may be in the form of a plate electrode) formed on a substrate 1 and an upper strip electrode 8' (may be formed as slit electrodes) as pixel electrode on a passivation layer 7. The strip electrode 8' is formed by processes such as exposure, development, etching and lifting off etc. Lights are allowed to pass through most part of a color filter substrate 12 and the array substrate with the multi-dimensional field formed therebetween, thereby achieving a wide viewing angle with high brightness. It is noted that the transmittance of the ADSDS LCD panel is associated with pitch a of strip electrode 8'.

In the ADSDS LCD panel, the pitch a of the strip electrodes is equal to a sum of a width (CD) b of a strip electrode and a spacing c between adjacent strip electrodes. In order to ensure a good brightness of the LCD panel, if the pitch a of the strip electrode is 10 µm, the width b of the strip electrode is 4 µm, and the spacing c between the electrodes is 6 µm; and if the pitch a of the strip electrode is 8 µm, the width b of the strip electrode is 2.6 µm, and the spacing c between the strip electrodes is 5.4 µm. An excellent brightness of the LCD panel may be achieved in case that the pitch a of the strip electrode is 6 µm, the width b of the strip electrode is 2 µm, and the spacing c is 4 µm. However, since a width limit that a conventional exposure apparatus may expose is in a range of 3-5.0 µm, it may be difficult to achieve a width b of the strip electrode less than 3 µm in reality. In addition, defects including mura or spots might occur due to width variation of the strip electrodes, thus decreasing display quality of the LCD panel.

Figure 2:
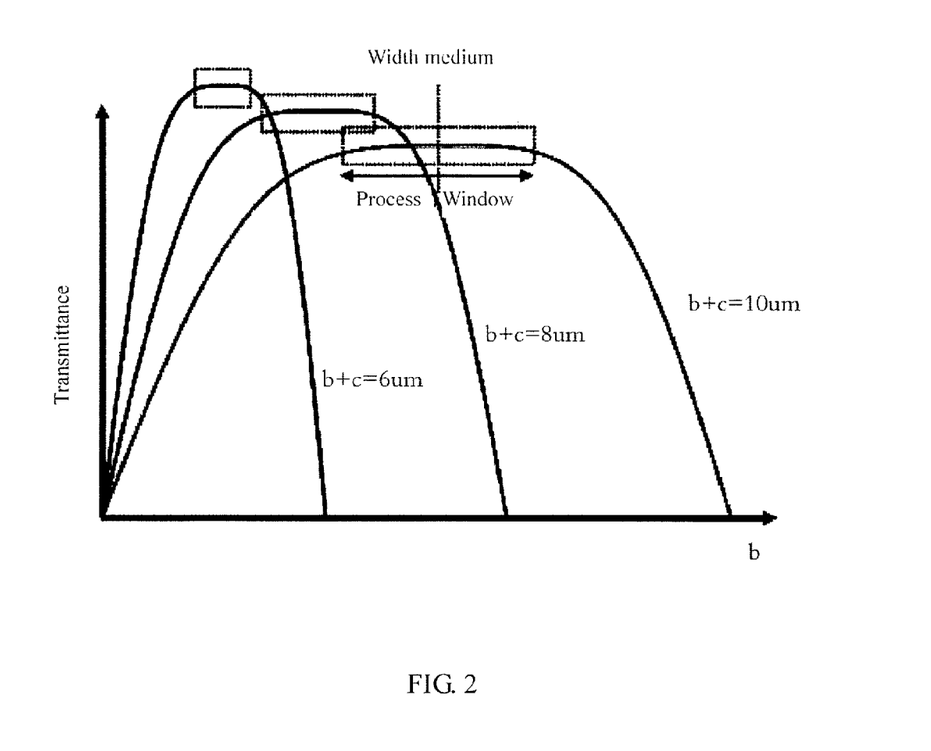
FIG. 2 is a graph illustrating the variation of the transmittance of the ADSDS panel as a function of the width of the strip electrode.

FIG. 2 shows the relationship between the transmittance of the LCD panel and the width b of the strip electrode. As the pitch a decreases, the brightness (i.e., transmittance) of the LCD panel increases. Despite of the increased brightness, the process window for maintaining a uniform brightness is decreased.

Figure 3:
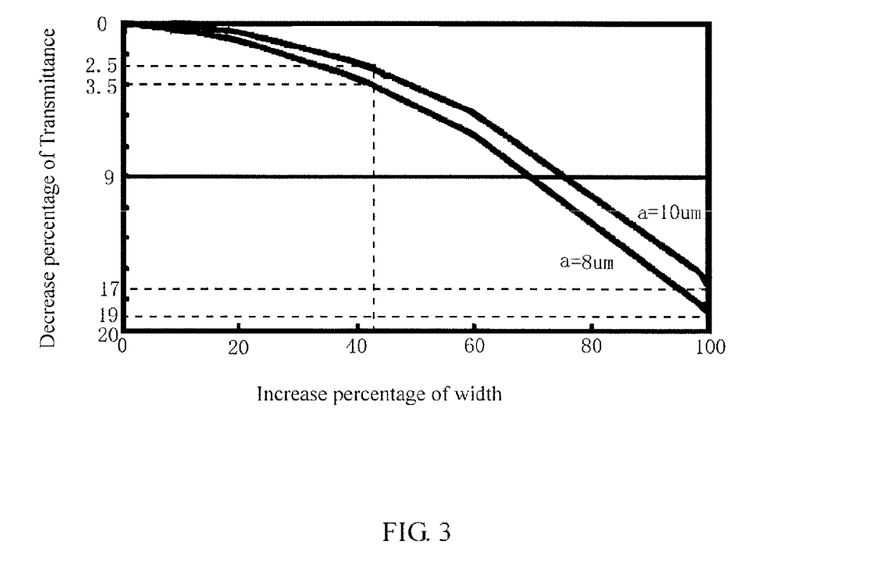
FIG. 3 is a graph illustrating the decrease percentage of the transmittance of the ADS LCD panel as a function of the percentage variation of the width of the strip electrode.

FIG. 3 shows a simulation of transmittance variation vs a variation of width b of the strip electrode. The two curves in FIG. 3 represent a case with a pitch a of the strip electrode of 8 µm and a case with a pitch a of 10 µm, respectively. It can be seen that in case of identical increase percentage of the width b, the transmittance changes more in the case with the pitch a of 8 µm than that in the case with the pitch a of 10 µm, thereby the former is more likely to cause defects such as spots or mura.

It may be known from FIG. 2 and FIG. 3 that the smaller the pitch a of the strip electrode, the better the brightness of the LCD panel is, and if the pitch a of the strip electrodes is the same for all strip electrodes, the smaller the width b of the strip electrode is, the better the brightness of the LCD panel is.

SUMMARY

The embodiments of the present disclosure provides a manufacturing method of an array substrate, comprising steps of: forming a gate electrode and a common electrode on a substrate; forming a gate insulating layer and an active layer on said substrate with said gate electrode and said common electrode; forming a source/drain layer comprising a source and a drain on said substrate with said gate insulating layer and said active layer; forming a passivation layer on said substrate with said source/drain layer, and forming a through hole on said passivation layer; and forming a pixel electrode on said substrate with said passivation layer formed with said through hole, the pixel electrode being connected to the drain of the source/drain layer through the through hole. Forming the pixel electrode comprises following steps of: first etching, ashing and second etching.

The embodiments of the present disclosure provides an array substrate comprising: a substrate, a gate electrode and a common electrode formed on the substrate; a gate insulated layer formed on the substrate and covering the gate electrode and the common electrode; an active layer and a source/drain layer comprising a source and a drain sequentially formed on the gate insulating layer and above the gate electrode; a passivation layer with a through hole formed thereon, said passivation layer formed on the substrate and covering the active layer, the source/drain layer, and the gate insulating layer; and a pixel electrode formed on the passivation layer and connected to the drain in the source/drain layer through the through hole.

A display apparatus according to still another embodiment of the present disclosure comprises the above-mentioned array substrate.

BRIEF DESCRIPTION OF THE DRAWINGS

The present invention will become more fully understood from the detailed description given hereinafter and the accompanying drawings which are given by way of illustration only, and thus are not limitative of the present invention.

FIG. 6a-FIG. 6F are respective structural views corresponding to each step in the step S5.

DETAILED DESCRIPTION OF THE PREFERRED EMBODIMENTS

Embodiments will now be described with reference to FIGS. 1 through 7, which relate to a memory device having at least one pre-treated surface for better adhesion of ink on the surface. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top," "bottom," "upper," "lower," "vertical" and/or "horizontal" as may be used herein are for convenience and illustrative purposes only, and are not meant to limit the description of the invention inasmuch as the referenced item can be exchanged in position.

The present disclosure provides a way to form a smaller strip electrode in order to improve the transmittance of the display device and reduce defects such as spots or mura.

An array substrate according to embodiments of the present disclosure comprises a plurality of gate lines and a plurality of data lines intersecting each other to define pixel units arranged in a matrix. Each pixel unit comprises a thin film transistor as a switch element, and a pixel electrode and a common electrode for controlling the arrangement of the liquid crystals. For example, in each pixel, the gate of the thin film transistor is electrically connected to or formed integrally with the corresponding gate line, the source of the thin film transistor is electrically connected to or formed integrally with the corresponding data line, the drain of the thin film transistor is electrically connected to or formed integrally with the corresponding pixel electrode. The following description is provided with respect to a single or a plurality of pixel units; however, other pixel units may be formed in the same manner.

First Embodiment

Figure 4:
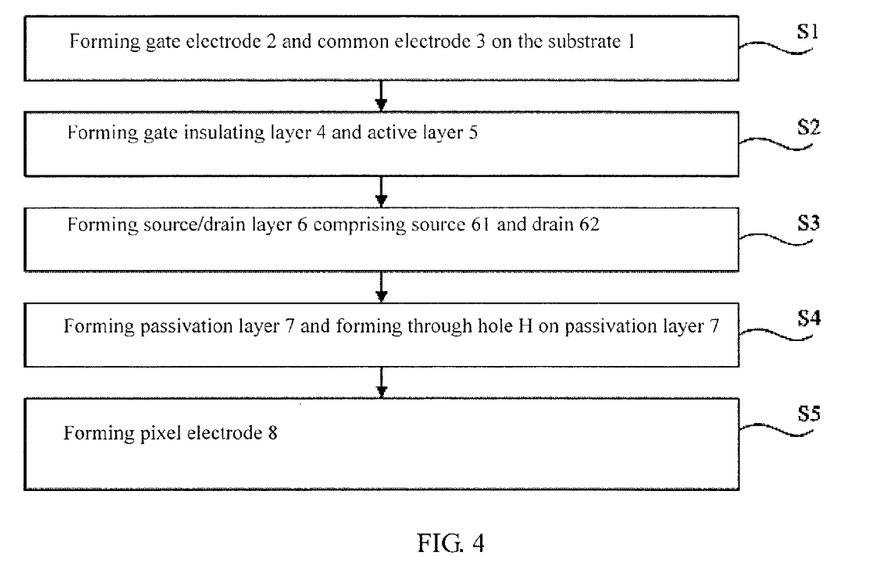
FIG. 4 is a flow chart of a manufacturing method of an array substrate according to an embodiment of the present disclosure.
Figure 7:
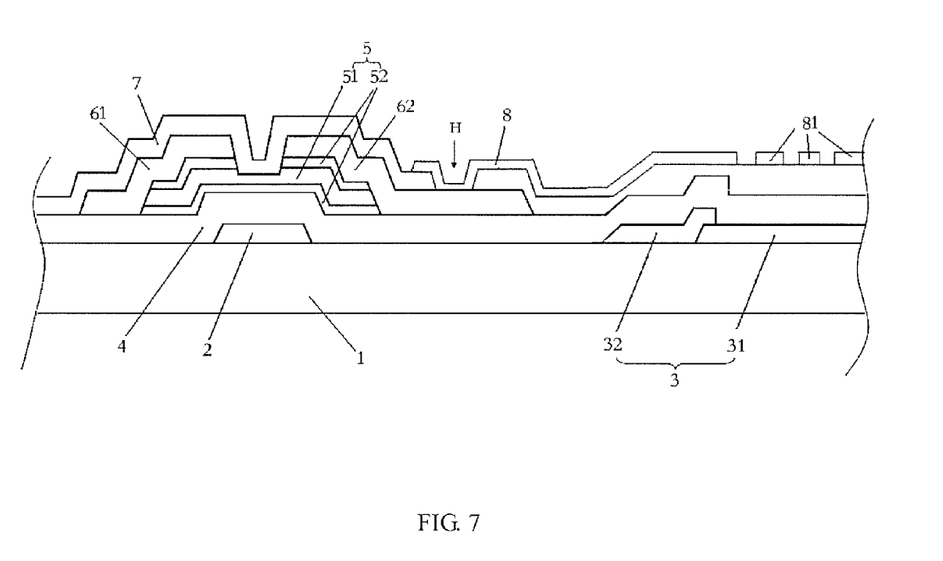
FIG. 7 is a partial schematic view of an array substrate according to the embodiments of the present disclosure.

FIG. 4 is a flow chart of a manufacturing method of an array substrate according to an embodiment of the present disclosure. As shown in FIG. 4 with reference to FIG. 7, the method according to the present embodiment comprises following steps:

Step S1, a transparent electrode 31, a gate electrode 2, a gate line (not shown) and a common electrode line 32 are formed on a substrate 1. The gate electrode 2, the gate line and the common electrode 32 may be formed from a metal thin film by patterning, and the transparent electrode 31 and the common electrode line 32 are electrically connected to each other to form the common electrode 3, ie. a plate electrode.

The metal film in Step S1 may comprise Mo, Cu, Al, AlNi alloy or the combinations thereof; the substrate 1 may be a glass substrate or a resin substrate etc.

Step S2, a gate insulating layer 4 and an amorphous Si thin film layer are deposited sequentially on the substrate 1 after Step S1, and an active layer 5 is formed on the gate insulating layer 4 by patterning.

The material of the gate insulating layer 4 in Step S2 may be selected from silicon nitride or silicon oxide, while the amorphous silicon thin film may includes a stack of a lower $n^+a$-Si amorphous silicon film 52, an a-Si amorphous silicon thin film 51 and an upper $n^+a$-Si amorphous silicon thin film 52, for example.

Step S3, a metal thin film is deposited on the substrate after step S2, then a source/drain layer 6 comprising a source 61 and a drain 62 is formed by patterning the metal thin film. The space between the source 61 and the drain 62 exposes a part of the upper $n^+a$-St amorphous silicon thin film 52. The exposed part of the upper $n^+a$-Si amorphous silicon thin film 52 is then etched off completely, and then a part of the subsequently exposed a-Si amorphous silicon thin film 51 is etched off, thus forming a TFT channel.

Step S4, a passivation layer 7 is deposited on the substrate after step S3, and a through hole H is formed on the passivation layer 7.

Step S5, a pixel electrode 8 is formed on the substrate 1 after step S4, with the pixel electrode 8 being connected to the drain 62 in the source/drain layer 6 through the through hole H. The pixel electrode 8 may for example comprise a plurality of strip electrodes 81 overlapping with the transparent electrode 31 with a spacing between two adjacent strip electrodes 81. The strip electrode 81 may be in a zigzaged shape or a linear shape. The process for forming the pixel electrode 8 at least comprises: a first etching, an ashing and a second etching process.

The patterning process described in the above steps at least comprises: coating, mask exposure, developing, etching, and lifting off or like.

Figure 5:
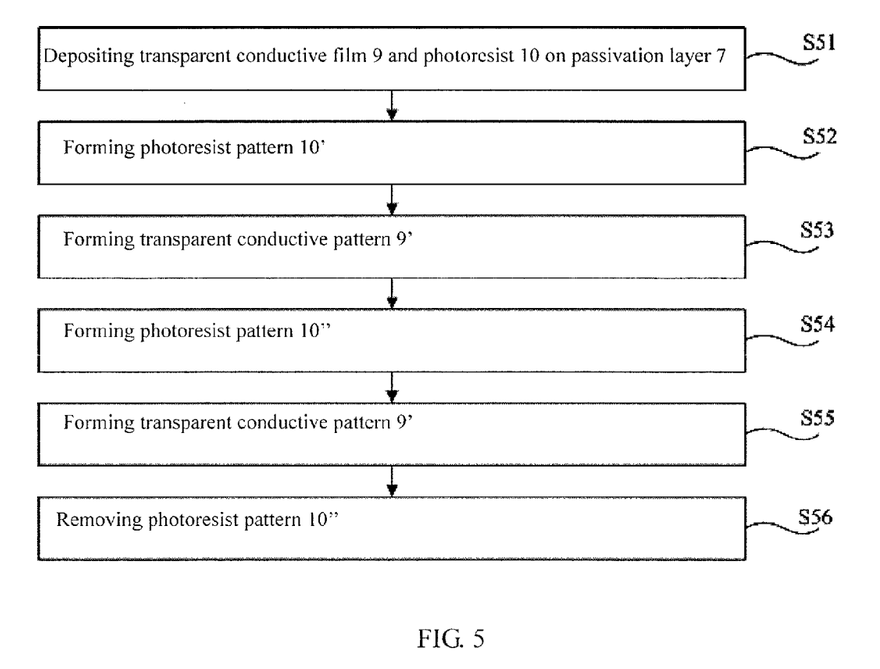
FIG. 5 is a flow chart of the step S5 in FIG. 4.

As shown in FIG. 5, the step S5 for example comprises following steps.

Figure 6A:
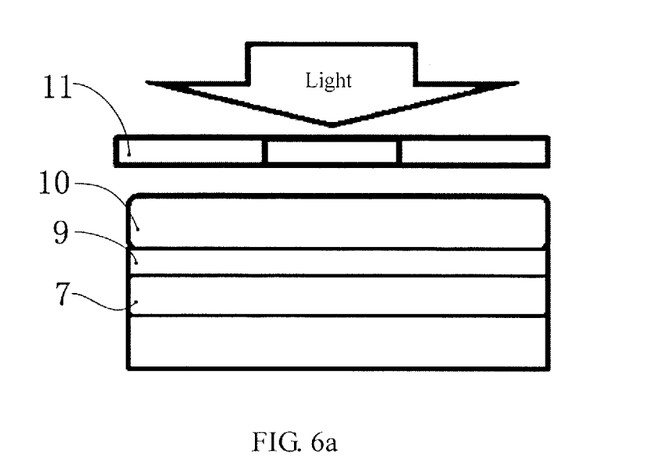

Step S51, as shown in FIG. 6a, a transparent conductive film 9 and a photoresist (PR) 10 are deposited on the passivation layer 7 sequentially. The transparent conductive film 9 may be an indium tin oxide (ITO) conductive film or an indium zinc oxide (IZO) conductive film. The present embodiment is described with respect to the ITO conductive film 9.

Figure 6B:
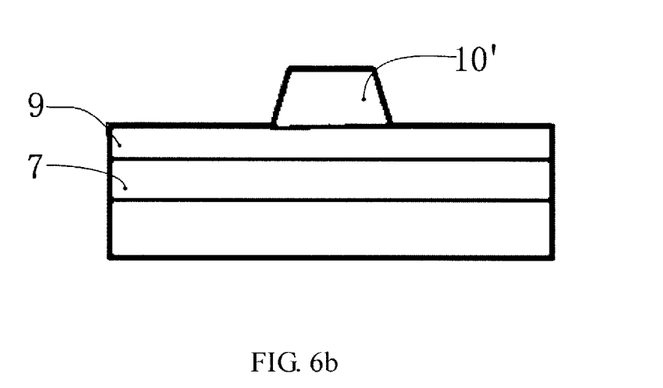

Step S52, a photoresist pattern 10' is formed by exposure and development of the photoresist 10 using a mask plate 11, as shown in FIG. 6b.

Figure 6C:
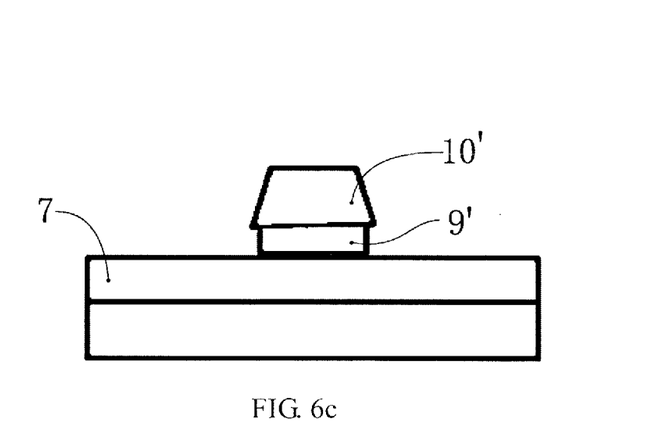

Step S53, a first etching process is performed on the ITO conductive film 9 in order to form the ITO conductive pattern 9', as shown in FIG. 6c.

Figure 6D:
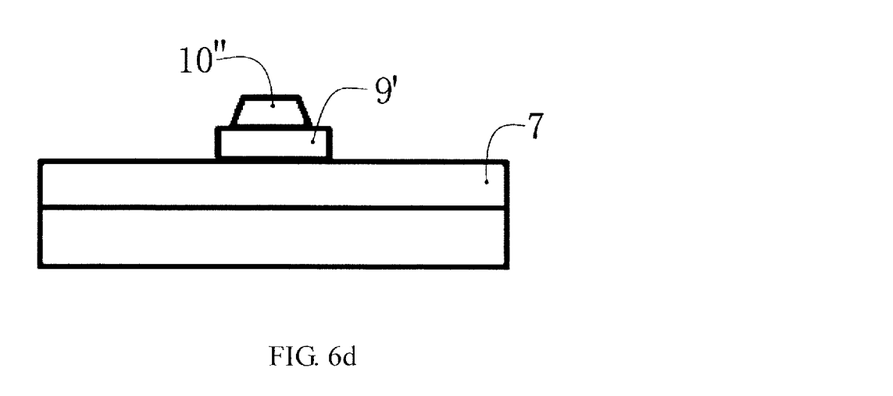

Step S54, an ashing process is performed on the photoresist pattern 10' in order to form the photoresist pattern 10", as shown in FIG. 6d.

Figure 6E:
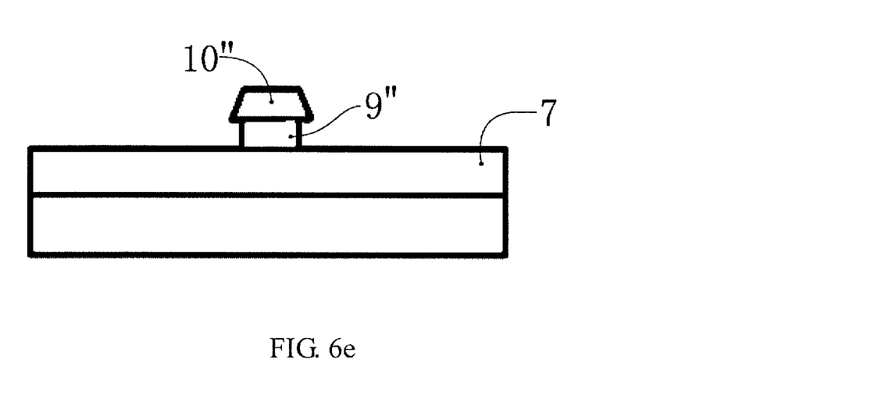

Step S55, a second etching process is performed on the ITO conductive pattern 9' using the photoresist pattern 10" as an etching mask in order to form the ITO conductive pattern 9''', as shown in FIG. 6e.

Figure 6F:
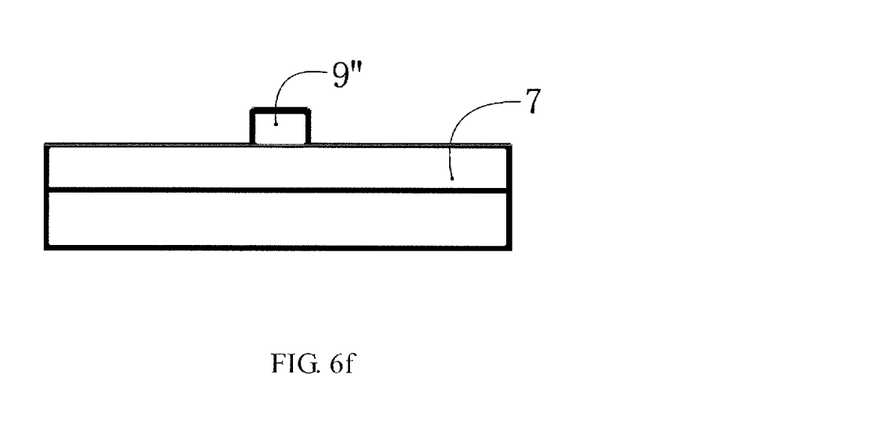

Step S56, a photoresist pattern 10" is removed such as by lifting off so as to form the ITO conductive pattern 9" as the strip electrode 81, as shown in FIG. 6f.

Despite that only one strip electrode 81 is shown in FIG. 5 by way of example, those skilled in the art may appreciate that all or part of the strip electrodes 81 included in the pixel electrode 8 in the present embodiment may be formed by the above processes.

Adding the ashing process and the second etching process after the first etching process, the pitch of strip electrodes 81 may be in a range of 4.5-6 μm and preferably 4.5 μm. The width of the strip electrode 81 may be in a range of 1.5-2 μm and preferably 1.5 μm. The spacing between two adjacent strip electrodes 81 may be in a range of 3-4 μm, and preferably 3 μm. In one embodiment of the present disclosure, the pitch of all strip electrodes 81 included in the pixel electrode 8 is in a range of 4.5-6 μm and preferably 4.5 μm; the width of each strip electrode 8 is in a range of 1.5-2 μm and preferably 1.5 μm; and the spacing between any two adjacent strip electrodes 81 may be in a range of 3-4 μm and preferably 3 μm. It can be verified by experiment that the brightness of the LCD panel according to the embodiment of the present disclosure is improved by 20-30%, and the transmittance is also increased, and the defects such as spots or mura are reduced.

Second Embodiment

As shown in FIG. 7, the embodiments of the present disclosure provide an array substrate comprising a substrate 1, a gate electrode 2 formed on the substrate 1, a gate line (not shown), a common electrode 32, and a gate insulating layer 4 formed on the substrate 1. The gate insulating layer 4 covers the gate electrode 2, the gate line and the common electrode. An active layer 5 and a source/drain layer 6 comprising a source 61 and a drain 62 are sequentially formed on the gate insulating layer 4 and above the gate electrode 2. And a passivation layer 7 is formed in the substrate 1, and a through hole H is formed in the passivation layer 7. A pixel electrode 8 is formed on the passivation layer 7 and connected to the drain electrode 62 in the source/drain layer 6 through the through hole H. The common electrode comprises a transparent electrode 31 and a common electrode 32. The pixel electrode 8 for example comprises a plurality of strip electrodes 81 overlapping with the transparent electrode 31, for example, with a slit gap present between two adjacent strip electrodes 81. The strip electrode 81 may be in a zigzaged shape or a linear shape.

The pitch of strip electrodes 81 is in a range of 4.5-6 μm, and preferably 4.5 μm; the width of the strip electrode 81 may be in a range of 1.5-2 μm, and preferably 1.5 μm; the spacing between two adjacent strip electrodes 81 is in a range of 3-4 μm, and preferably 3 μm. In one embodiment of the present disclosure, the pitch of all strip electrodes 81 included in the pixel electrode 8 is in a range of 4.5-6 μm, and preferably 4.5 μm; the width of each strip electrodes 8 is in a range of 1.5-2 μm, and preferably 1.5 μm; the spacing between any two adjacent strip electrodes 81 may be in a range of 3-4 μm, and preferably 3 μM.

Third Embodiment

A display apparatus according to still another embodiment of the present disclosure comprises the array substrate according to any of the embodiments described as above. The display apparatus according to the embodiments of the present disclosure may be a LCD apparatus comprising a counter substrate. The display apparatus for example may be used in LCD TV, cell phones, LCD displays, GPS etc. The array substrate and the counter substrate are provided opposing each other so as to form a liquid crystal cell with liquid crystal material filled therein. The counter substrate may be a color filter substrate. The pixel electrode in each pixel unit of the array substrate is used to apply an electric field to control the rotation of the liquid crystal materials, thereby operating the display apparatus. In some of the exemplary embodiments, the LCD display apparatus further comprises a back-light unit to provide back lights for the array substrate.

The display apparatus according to the embodiments of the present disclosure may for example be a display apparatus of any other type without a color filter substrate such as an electronic paper display apparatus.

Each embodiment of the present disclosure may be applied to an ADSDS type LCD apparatus or an IPS type LCD apparatus.

According to the above embodiments, when the strip electrodes are formed, the aching and the second etching process are added following the first etching, which make the pattern of the strip electrodes is smaller, leading to an improvement of the brightness and transmittance of the display device, thereby reducing the defects such as spots and mura, and improving the display quality of the LCD panel.

According to the descriptions above, the embodiments of the present disclosure may at least provide apparatus and methods as below.

(1) A manufacturing method of an array substrate, comprising steps of: forming a gate electrode and a common electrode on a substrate; forming a gate insulating layer and an active layer on said substrate with said gate electrode and said common electrode; forming a source/drain layer comprising a source and a drain on said substrate with said gate insulating layer and said active layer; forming a passivation layer on said substrate with said source/drain layer, and forming a through hole on said passivation layer; and forming a pixel electrode on said substrate with said passivation layer formed with said through hole, the pixel electrode being connected to the drain of the source/drain layer through the through hole; wherein forming the pixel electrode comprises following steps of a first etching, an ashing and a second etching process.

(2) The method according to (1), wherein the process for forming the pixel electrode layer comprises: depositing a transparent conductive film and a photoresist sequentially on the passivation layer; exposing and developing said photoresist to form a first photoresist pattern; performing the first etching on the transparent conductive film using the first photoresist pattern as a mask to form a first transparent conductive pattern; performing the ashing on the first photoresist pattern to form a second photoresist pattern; performing the second etching on the first transparent conductive pattern using the second photoresist pattern as a mask to form a second transparent conductive pattern; and lifting off the second photoresist pattern.

(3). The method according to (1) or (2), wherein the pixel electrode is formed as at least two adjacent strip electrodes, said at least two adjacent strip electrodes has a pitch of 4.5-6 μm, and at least one of the said at least two adjacent strip electrodes has a width of 1.5-2 μm.

(4). The method according to (3), wherein said at least two adjacent strip electrodes has a pitch of 4.5 μm, and at least one of the said at least two adjacent strip electrodes has a width of 1.5 μm.

(5). The method according to (1), wherein the pixel electrode is formed to at least partially overlap with the common electrode.

(6). The method according to (1), wherein the common electrode is in the form of a plate.

(7). An array substrate manufactured according to claim 1, comprising: a substrate, a gate electrode and a common electrode formed on the substrate; a gate insulated layer formed on the substrate and covering the gate electrode and the common electrode; an active layer and a source/drain layer comprising a source and a drain sequentially formed on the gate insulating layer and above the gate electrode; a passivation layer with a through hole formed thereon, said passivation layer formed on the substrate and covering the active layer, the source/drain layer, and the gate insulating layer; and a pixel electrode formed on the passivation layer and connected to the drain in the source/drain layer through the through hole.

(8). The array substrate according to (7), wherein the pixel electrode is formed as comprising at least two adjacent strip electrodes, said at least two adjacent strip electrodes has a pitch of 4.5-6 µm, and at least one of the said at least two adjacent strip electrodes has a width of 1.5-2 µm.

(9). The array substrate according to (7), wherein the pitch of said at least two adjacent strip electrodes is 4.5 µm, and at least one of the said at least two adjacent strip electrodes has a width of 1.5 µm.

(10) a display apparatus, comprising the array substrate according to (7).

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical disclosure to thereby enable others skilled in the art to best utilize the invention in various embodiments and with various modifications as are suited to the particular use contemplated. It is intended that the scope of the invention be defined by the claims appended hereto.

What is claimed is:

1. A manufacturing method of an array substrate, comprising steps of:
    forming a gate electrode and a common electrode on a substrate;
    forming a gate insulating layer and an active layer on said substrate with said gate electrode and said common electrode;
    forming a source/drain layer comprising a source and a drain on said substrate with said gate insulating layer and said active layer;
    forming a passivation layer on said substrate with said source/drain layer, and forming a through hole on said passivation layer; and
    forming a pixel electrode on said substrate with said passivation layer formed with said through hole, the pixel electrode being connected to the drain of the source/drain layer through the through hole;
    wherein forming the pixel electrode comprises following steps of: a first etching, an ashing and a second etching,
    wherein the active layer consists of a lower n+a-Si amorphous silicon film, an a-Si amorphous silicon thin film and an upper n+a-Si amorphous silicon thin film,
    wherein forming the gate insulating layer and the active layer on said substrate with said gate electrode and said common electrode comprises:
    sequentially depositing the gate insulating layer and an amorphous Si thin film layer consisting of the lower n+a-Si amorphous silicon film, the a-Si amorphous silicon thin film and the upper n+a-Si amorphous silicon thin film on the substrate;
    patterning the amorphous Si thin film layer to form the active layer on the gate insulating layer.

2. The method according to claim 1, wherein the step of forming the pixel electrode comprises:
    depositing a transparent conductive film and a photoresist sequentially on the passivation layer;
    exposing and developing said photoresist to form a first photoresist pattern;
    performing the first etching on the transparent conductive film using the first photoresist pattern as a mask to form a first transparent conductive pattern;
    performing the ashing on the first photoresist pattern to form a second photoresist pattern;
    performing the second etching on the first transparent conductive pattern using the second photoresist pattern as a mask to form a second transparent conductive pattern; and
    removing the second photoresist pattern.

3. The method according to claim 1, wherein the pixel electrode is formed to at least partially overlap with the common electrode.

4. The method according to claim 1, wherein the common electrode is in the form of a plate.

5. The method according to claim 1, wherein the pixel electrode is formed as at least two adjacent strip electrodes, said at least two adjacent strip electrodes has a pitch of 4.5-6 µm, and at least one of the said at least two adjacent strip electrodes has a width of 1.5-2 µm.

6. The method according to claim 5, wherein said at least two adjacent strip electrodes has a pitch of 4.5 µm, and at least one of the said at least two adjacent strip electrodes has a width of 1.5 µm.

7. An array substrate comprising:
    a substrate, a gate electrode and a common electrode formed on the substrate;
    a gate insulated layer formed on the substrate and covering the gate electrode and the common electrode;
    an active layer and a source/drain layer comprising a source and a drain sequentially formed on the gate insulating layer and above the gate electrode;
    a passivation layer with a through hole formed thereon, said passivation layer formed on the substrate and covering the active layer, the source/drain layer, and the gate insulating layer; and
    a pixel electrode formed on the passivation layer and connected to the drain in the source/drain layer through the through hole,
    wherein the active layer consists of a lower n+a-Si amorphous silicon film, an a-Si amorphous silicon thin film and an upper n+a-Si amorphous silicon thin film.

8. A display apparatus, comprising the array substrate according to claim 7.

9. The array substrate according to claim 7, wherein the pixel electrode is formed as at least two adjacent strip electrodes, said at least two adjacent strip electrodes has a pitch of 4.5-6 µm, and at least one of the said at least two adjacent strip electrodes has a width of 1.5-2 µm.

10. The array substrate according to claim 9, wherein the pitch of said at least two adjacent strip electrodes is 4.5 µm, and at least one of the said at least two adjacent strip electrodes has a width of 1.5 µm.

* * * * *